(12) United States Patent
Chu

(10) Patent No.: US 10,910,447 B2
(45) Date of Patent: Feb. 2, 2021

(54) DISPLAY DEVICE AND METHOD OF MANUFACTURING THE SAME

(71) Applicant: SAMSUNG DISPLAY CO., LTD., Yongin-si (KR)

(72) Inventor: Seungjin Chu, Cheonan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/776,979

(22) Filed: Jan. 30, 2020

(65) Prior Publication Data

US 2020/0251529 A1 Aug. 6, 2020

(30) Foreign Application Priority Data

Feb. 1, 2019 (KR) ........................ 10-2019-0013792

(51) Int. Cl.
*G02F 1/13357* (2006.01)
*H01L 27/32* (2006.01)
*F21V 8/00* (2006.01)

(52) U.S. Cl.
CPC .......... *H01L 27/322* (2013.01); *G02B 6/0051* (2013.01); *G02F 1/133606* (2013.01); *G02F 2001/133614* (2013.01)

(58) Field of Classification Search
None
See application file for complete search history.

(56) References Cited

U.S. PATENT DOCUMENTS

| 7,990,495 B2 | 8/2011 | Yamabuchi et al. |
| 9,685,628 B2 | 6/2017 | Dan et al. |
| 2006/0098155 A1 | 5/2006 | Choo et al. |
| 2008/0173885 A1* | 7/2008 | Kuromizu ............ H01L 33/405 257/98 |
| 2018/0143369 A1 | 5/2018 | Kim et al. |
| 2019/0154901 A1* | 5/2019 | Lee ........................ G02F 1/1336 |
| 2019/0221724 A1* | 7/2019 | Song .................... G02B 6/0229 |

FOREIGN PATENT DOCUMENTS

| KR | 10-0628438 | 9/2006 |
| KR | 10-0633488 | 10/2006 |
| KR | 10-2016-0044511 | 4/2016 |
| KR | 10-2016-0070904 | 6/2016 |

\* cited by examiner

*Primary Examiner* — Elmito Breval
(74) *Attorney, Agent, or Firm* — F. Chau & Associates, LLC

(57) ABSTRACT

A display device and a method of manufacturing the display device being capable of substantially preventing infiltration of moisture or oxygen ($O_2$) into a quantum dot layer by scribe cutting a display panel including quantum dots and then thermally curing a cell edge portion with laser for sealing the quantum dot layer in a manufacturing process are provided. The display device includes: a glass plate; a first passivation layer disposed on the glass plate; a wavelength conversion layer disposed on the first passivation layer; a second passivation layer disposed on the wavelength conversion layer; an optical sheet disposed on the second passivation layer; a display panel disposed on the optical sheet; and a laser trim portion extending along edges of the first passivation layer, the wavelength conversion layer, and the second passivation layer.

26 Claims, 12 Drawing Sheets

FIG. 6
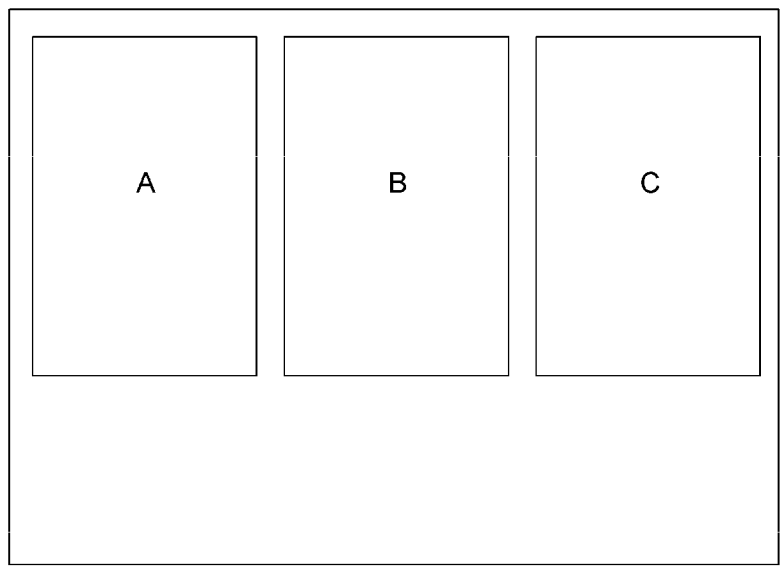
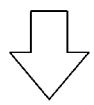
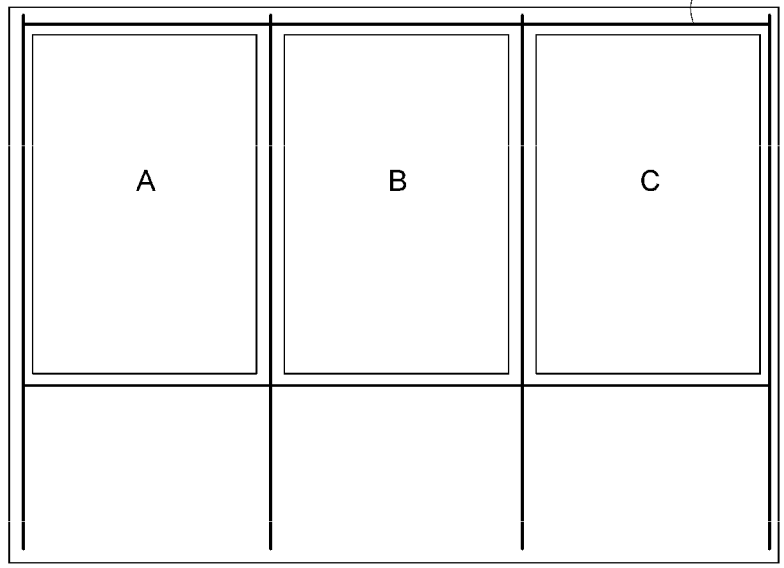

FIG. 8
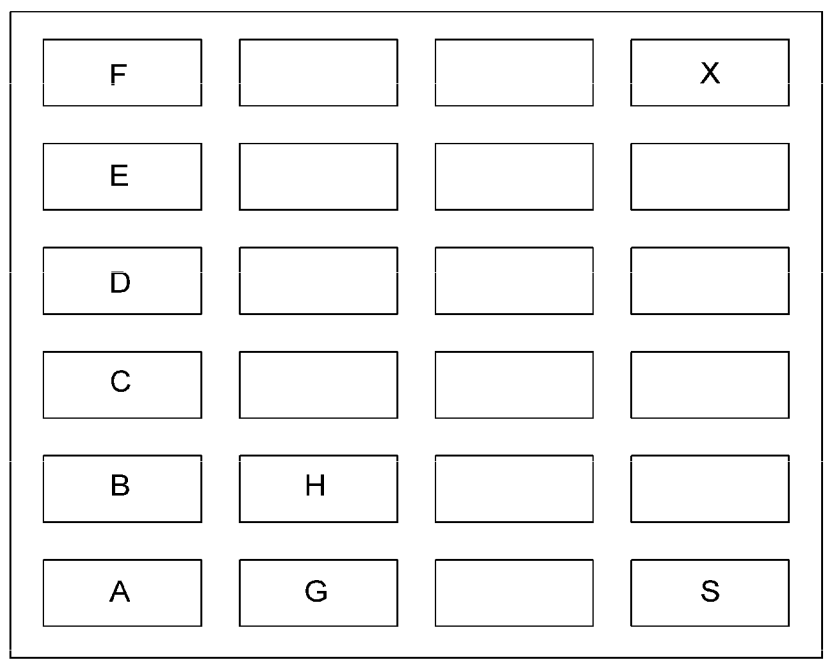
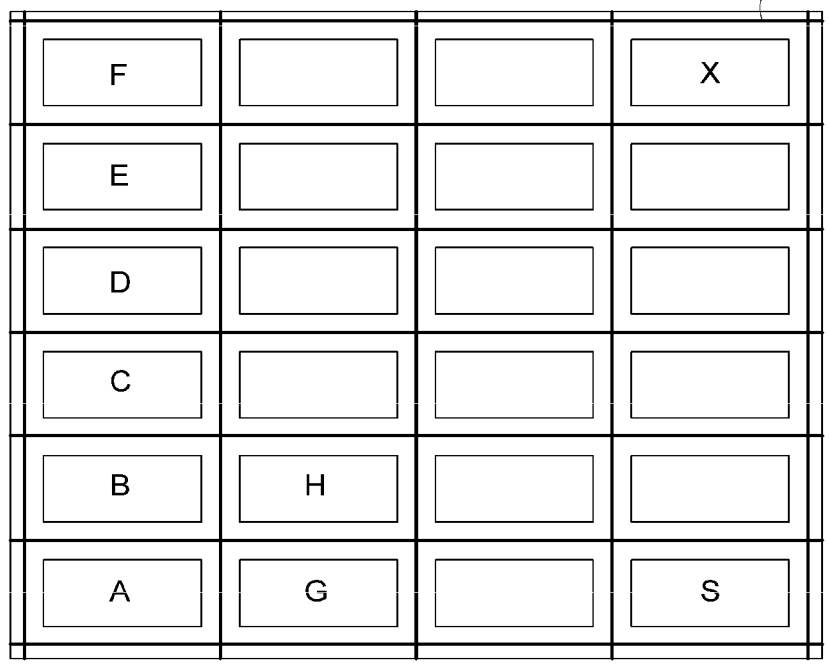

FIG. 13
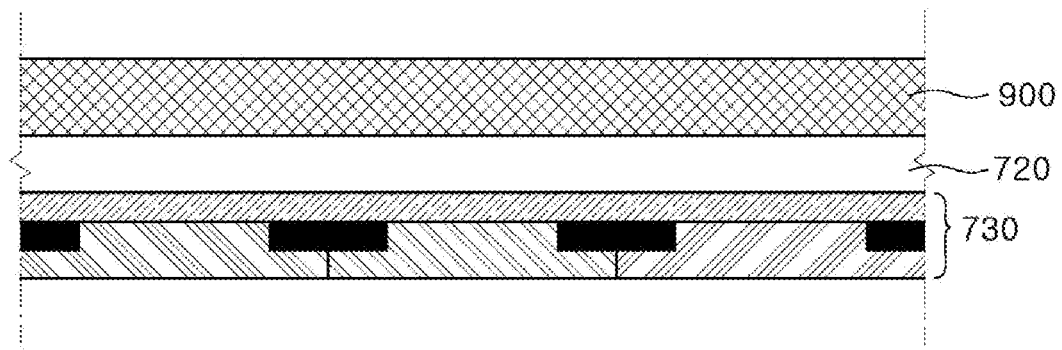
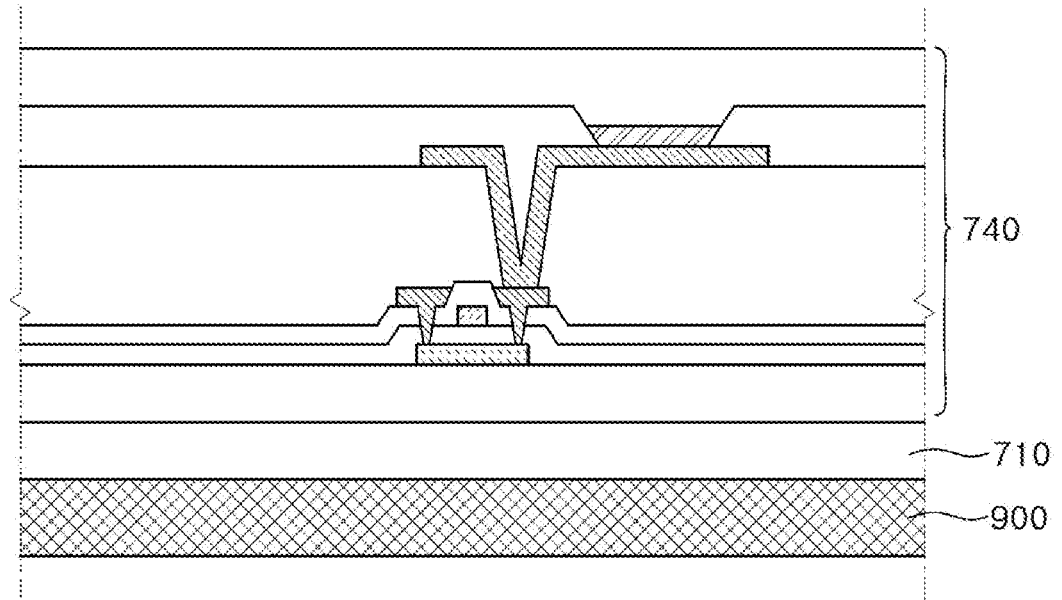

DISPLAY DEVICE AND METHOD OF MANUFACTURING THE SAME

CROSS-REFERENCE TO RELATED APPLICATION

This application claims priority under 35 U.S.C. § 119 to Korean Patent Application No. 10-2019-0013792, filed on Feb. 1, 2019, in the Korean Intellectual Property Office (KIPO), the disclosure of which is incorporated by reference herein in its entirety.

TECHNICAL FIELD

Exemplary embodiments of the present invention relate to a display device, more particularly, to a display device capable of substantially preventing infiltration of moisture or oxygen ($O_2$) into a quantum dot layer, and to a method of manufacturing the display device.

DISCUSSION OF RELATED ART

In general, quantum dot (QD) display devices, which are either photo-emissive or electro-emissive, are more desirable over liquid crystal display (LCD) devices in that they have better color accuracy, higher color saturation, possibly wider contrast ratio, and higher peak brightness, thereby making quantum dot technology ideal for producing displays capable of ultra-high definition. However, a light emitting element including quantum dots may have a drawback that deterioration may easily occur due to external factors such as moisture and oxygen being introduced from outside.

The quantum dot display device may have a structure in which a low refractive index layer, a bottom barrier layer, a quantum dot layer, a top barrier layer, and an overcoat layer are disposed on a glass plate.

In a scribe cutting process for cutting such a structure into cell units, a cell edge portion may not be neatly cut if the thicknesses of an upper layer of the quantum dot layer and the glass plate are too thick to cut. Since, the cell edge portion may not be neatly cut, a separation may occur between the quantum dot layer and one or both of the bottom barrier layer and the top barrier layer, thereby causing reliability failure such as defective quantum dot discoloration on the cell edge portion.

SUMMARY

Exemplary embodiments of the present invention may be directed to a display device capable of substantially preventing infiltration of moisture or oxygen ($O_2$) into a quantum dot layer by scribe cutting a display panel including quantum dots and then thermally curing a cell edge portion with laser for sealing the quantum dot layer in a manufacturing process, and to a method of manufacturing the display device.

According to an exemplary embodiment of the present invention, a display device includes: a glass plate; a first passivation layer disposed on the glass plate; a wavelength conversion layer disposed on the first passivation layer; a second passivation layer disposed on the wavelength conversion layer; an optical sheet disposed on the second passivation layer; a display panel disposed on the optical sheet; and a laser trim portion extending along edges of the first passivation layer, the wavelength conversion layer, and the second passivation layer, The laser trim portion may include a carbonized material.

The laser trim portion may include: a first laser trim portion extending from the first passivation layer; a second laser trim portion extending from the second passivation layer; and a side cover layer extending from the wavelength conversion layer.

At least one of the first laser trim portion, the second laser trim portion, and the side cover layer may include a carbonized material.

The first laser trim portion and the second laser trim portion may not overlap the wavelength conversion layer.

The laser trim portion may include: a first laser trim portion extending from the first passivation layer; a second laser trim portion extending from the second passivation layer; and a side cover layer extending from the first laser trim portion, the wavelength conversion layer, and the second laser trim portion.

At least one of the first laser trim portion, the second laser trim portion, and the side cover layer may include a carbonized material.

The first laser trim portion and the second laser trim portion may overlap the wavelength conversion layer.

The first laser trim portion and the second laser trim portion may not overlap the wavelength conversion layer.

The first passivation layer may include: a low refractive index layer disposed on the glass plate; and a first barrier layer disposed on the low refractive index layer.

The second passivation layer may include: a second barrier layer disposed on the wavelength conversion layer; and an overcoat layer disposed on the second barrier layer.

The wavelength conversion layer may include wavelength converting particles that convert a wavelength of at least a part of incident light.

The wavelength converting particles may include a quantum dot (QD) fluorescent material or a phosphorescent material.

According to an exemplary embodiment of the present invention, a method of manufacturing a display device, the method includes: disposing a first passivation layer on a glass plate; disposing a wavelength conversion layer on the first passivation layer; disposing a second passivation layer on the wavelength conversion layer; disposing an optical sheet on the second passivation layer; disposing a display panel on the optical sheet; and thermally curing the first passivation layer, the wavelength conversion layer, and the second passivation layer, and sealing the same along a boundary of a cell using laser.

In the thermally curing of the first passivation layer, the wavelength conversion layer, and the second passivation layer, and sealing the same along the boundary of the cell using laser, a laser trim portion extending along edges of the first passivation layer, the wavelength conversion layer, and the second passivation layer may be formed.

The laser trim portion may include a carbonized material.

In the thermally curing of the first passivation layer, the wavelength conversion layer, and the second passivation layer, and sealing the same along the boundary of the cell using laser, the laser trim portion may include: a first laser trim portion extending from the first passivation layer; a second laser trim portion extending from the second passivation layer; and a side cover layer extending from the wavelength conversion layer.

In the thermally curing of the first passivation layer, the wavelength conversion layer, and the second passivation layer, and sealing the same along the boundary of the cell using laser, the laser trim portion may include: a first laser trim portion extending from the first passivation layer; a second laser trim portion extending from the second passivation layer; and a side cover layer extending from the first laser trim portion, the wavelength conversion layer, and the second laser trim portion.

At least one of the first laser trim portion, the second laser trim portion, and the side cover layer may include a carbonized material.

The first laser trim portion and the second laser trim portion may overlap the wavelength conversion layer.

The first laser trim portion and the second laser trim portion may not overlap the wavelength conversion layer.

In the disposing of the second passivation layer on the wavelength conversion layer, the wavelength conversion layer may include wavelength converting particles that convert a wavelength of at least a part of incident light.

The wavelength converting particles may include a quantum dot (QD) fluorescent material or a phosphorescent material.

According to an exemplary embodiment of the present invention, a display device includes: a reflective sheet; a diffusion plate disposed on the reflective sheet; a light source unit disposed between the reflective sheet and the diffusion plate, or disposed to face a side surface of a light guide plate included in the diffusion plate; an optical sheet disposed on the diffusion plate; and a display panel disposed on the optical sheet 800. The diffusion plate may include: a glass plate; a low refractive index layer disposed on the glass plate; a first barrier layer disposed on the low refractive index layer; a wavelength conversion layer disposed on the first barrier layer; a second barrier layer disposed on the wavelength conversion layer; an overcoat layer disposed on the second barrier layer; and a laser trim portion extending at least along edges of the first barrier layer, the wavelength conversion layer, and the second barrier layer.

The wavelength conversion layer may include wavelength converting particles, which may include a quantum dot (QD) fluorescent material or a phosphorescent material, uniformly dispersed in a resin.

The foregoing is illustrative only and is not intended to be in any way limiting.

BRIEF DESCRIPTION OF THE DRAWINGS

A more complete appreciation of the present invention will become more apparent by describing in detail exemplary embodiments thereof with reference to the accompanying drawings, in which:

FIGS. 6 to 8 are views each illustrating an exemplary embodiment of the present invention, in which a laser trim portion is formed at a cell boundary after a diffusion plate according to an exemplary embodiment of the present invention is divided into cell units;

FIGS. 13 and 14 are views illustrating an exemplary embodiment of the present invention, in which a color filter layer and an organic light emitting layer are formed between a first substrate and a second substrate of a display panel according to an exemplary embodiment of the present invention.

Figure 1:
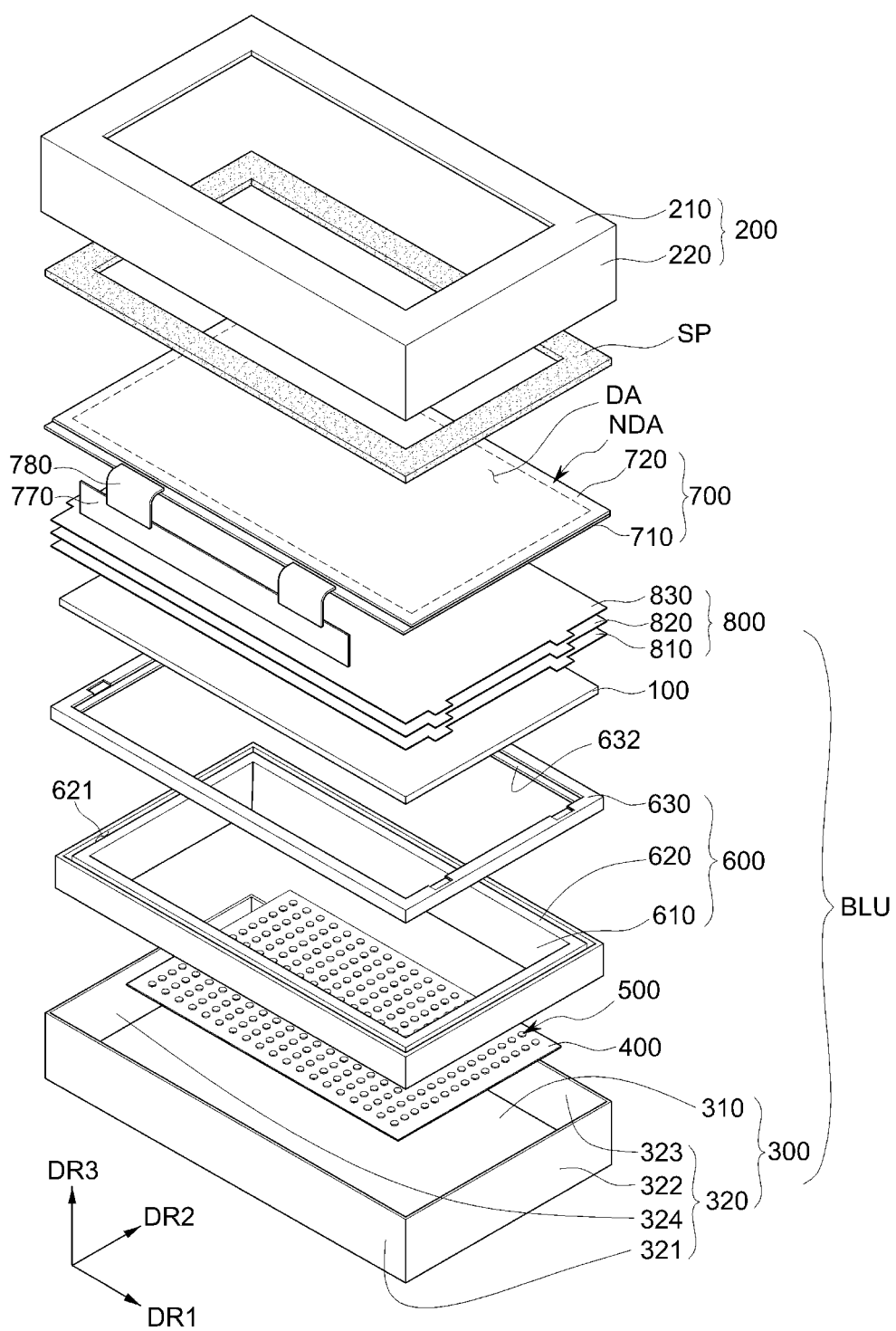
FIG. 1 is an exploded perspective view illustrating a display device including a diffusion plate according to an exemplary embodiment of the present invention.

Since the drawings in FIGS. 1-14 are intended for illustrative purposes, the elements in the drawings are not necessarily drawn to scale. For example, some of the elements may be enlarged or exaggerated for clarity purpose.

DETAILED DESCRIPTION OF THE EMBODIMENTS

Exemplary embodiments will now be described more fully hereinafter with reference to the accompanying drawings. Although the present invention may be modified in various manners and may have several exemplary embodiments, the exemplary embodiments are illustrated in the accompanying drawings and will be mainly described in the specification. However, the present invention is not limited to the disclosed exemplary embodiments and should be construed as to cover all the changes, equivalents and substitutions included within the spirit and scope of the present invention.

When a layer, area, or plate is referred to as being "on" another layer, area, or plate, it may be directly on the other layer, area, or plate, or intervening layers, areas, or plates may also be present. Conversely, when a layer, area, or plate is referred to as being "directly on" another layer, area, or plate, intervening layers, areas, or plates may be absent. Further when a layer, area, or plate is referred to as being "below" another layer, area, or plate, it may be directly below the other layer, area, or plate, or intervening layers, areas, or plates may also be present. Conversely, when a layer, area, or plate is referred to as being "directly below" another layer, area, or plate, intervening layers, areas, or plates may be absent.

The spatially relative terms "below", "beneath", "lower", "above", "upper" and the like, may be used herein for ease of description to describe the relations between one element or component and another element or component as illustrated in the drawings. It will be understood that the spatially relative terms are intended to encompass different orientations of the device in use or operation, in addition to the orientation illustrated in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Throughout the specification, when an element is referred to as being "connected" to another element, the element is "directly connected" to the other element, or "electrically connected" to the other element with one or more intervening elements interposed therebetween. It will be further understood that the terms "comprises", "comprising", "includes" and/or "including" when used in this specification, specify the presence of stated features, integers, steps, operations, elements, components and/or groups, but do not preclude the presence or addition of one or more other features, integers, steps, operations, elements, components, and/or groups.

It will be understood that, although the terms "first", "second", "third", and the like may be used herein to describe various elements, these elements should not be limited by these terms. These terms are only used to distinguish one element from another element. Accordingly, "a first element" discussed below could be termed "a second element" or "a third element" and "a second element" and "a third element" may be termed likewise without departing from the teachings of the present invention.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Also, to overlap two constituent elements means that the two constituent elements are overlapped with each other in the third direction (e.g., a direction perpendicular to an upper surface of the substrate) unless stated otherwise.

Unless otherwise defined, all terms used herein (including technical and scientific terms) have the same meaning as commonly understood by those skilled in the art to which the present invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

Some of the parts which are not associated with the description may not be provided in order to specifically describe exemplary embodiments of the present invention and like reference numerals refer to like elements throughout the specification.

Hereinafter, a display device according to an exemplary embodiment of the present invention will be described with reference to FIGS. 1 to 14.

A display device according to an exemplary embodiment of the present invention may be applied to a quantum dot display device including a quantum dot layer. Such quantum dot display devices may include a diffusion plate for dispersing and diffusing light emitted from a light source to enhance light uniformity.

FIG. 1 is an exploded perspective view illustrating a display device including a diffusion plate according to an exemplary embodiment of the present invention.

Referring to FIG. 1, a display device according to an exemplary embodiment of the present invention includes a diffusion plate 100 for dispersing and diffusing light emitted from a light source unit 500 to achieve uniform light distribution.

The diffusion plate 100 is disposed on a reflective sheet 400, and the reflective sheet 400 is disposed on a bottom cover 300.

An optical sheet 800 is disposed on the diffusion plate 100, and a display panel 700 is disposed on the optical sheet 800. The display panel 700 includes a first substrate 710 and a second substrate 720.

Figure 5:
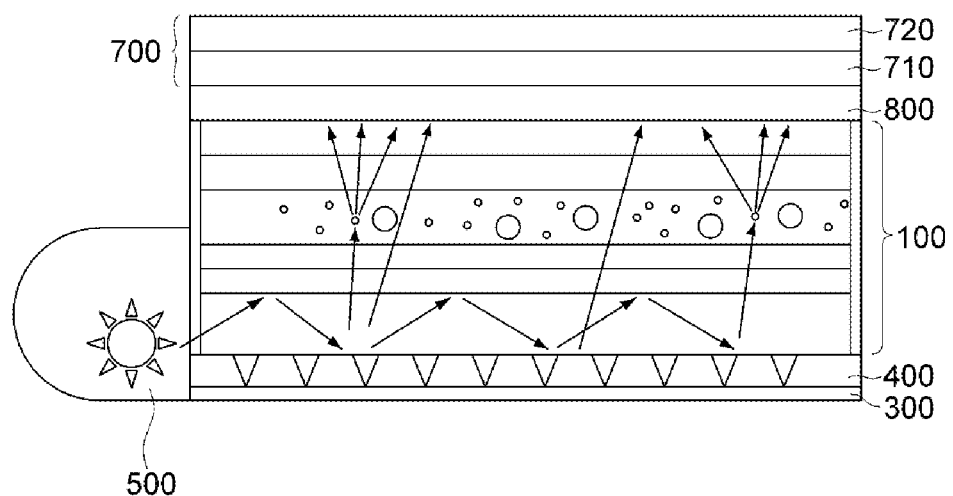
FIG. 5 is a view illustrating an exemplary embodiment of the present invention, in which an edge type backlight unit is applied to a diffusion plate.

The display device according to an exemplary embodiment of the present invention includes a backlight unit that emits light to the display panel 700. Such backlight units may be classified into a direct type and an edge type. The direct type backlight unit has a structure in which a plurality of light sources are disposed below the display panel 700, as illustrated in FIG. 1. In addition, the edge type backlight unit has a structure in which light sources are disposed to face a side surface of a light guide plate, and the plurality of optical sheets 800 are disposed between the display panel 700 and the light guide plate, as illustrated in FIG. 5. The light guide plate may guide the light generated by the light source unit 500 to the display panel 700.

The display device according to an exemplary embodiment of the present invention may include a display panel 700, a top cover 200 and a backlight unit BLU, as illustrated in FIG. 1.

The display panel 700 receives light from the backlight unit BLU and displays images. The display panel 700 may be a light-receiving display panel such as a liquid crystal display ("LCD") panel. Alternatively, the display panel 700 may be one of an electrophoretic display panel, a microelectromechanical system (MEMS) display panel, an electrowetting display panel, an electrochromic display panel and an organic light emitting display panel, but the present invention is not limited thereto. Hereinafter, the display panel 700 will be described as an LCD panel by way of example.

The display panel 700 may be divided into a display area DA for displaying images and a non-display area NDA that surrounds the display area DA and does not display images.

The display panel 700 includes a first substrate 710, a second substrate 720 opposing the first substrate 710, and a liquid crystal layer disposed between the first and second substrates 710 and 720.

The first substrate 710 may include gate lines, data lines, thin film transistors, and pixel electrodes. The gate lines and the data lines may be insulated from each other and intersect each other. The thin film transistor, which is a three-terminal element, is connected to one of the gate lines, one of the data lines, and one of the pixel electrodes. A data voltage applied to the data line may be applied to the pixel electrode according to a signal applied to the gate line.

The second substrate 720 may be disposed facing the first substrate 710 with a liquid crystal layer interposed therebetween. The second substrate 720 may include a color filter and a common electrode. However, the present invention is not limited thereto. For example, in an exemplary embodiment of the present invention, at least one of the color filter and the common electrode may be formed at the first substrate 710. In an exemplary embodiment of the present invention, the second substrate 720 may be omitted, and a liquid crystal layer encapsulated by a color filter, a common electrode, and an insulating layer may be disposed on the first substrate 710.

The second substrate 720 may have a size less than a size of the first substrate 710 in a plan view. A part of the first substrate 710 may be exposed by the second substrate 720. The exposed part of the first substrate 710 may provide a space for mounting a driving chip or an external circuit board.

The liquid crystal layer may include a plurality of liquid crystal molecules that change their alignment state in accordance with an electric field formed between the first substrate 710 and the second substrate 720.

In FIG. 1, the display panel 700 is depicted as having a quadrangular shape in a plan view. A long side of the display panel 700 may extend in a first direction DR1, and a short side of the display panel 700 may extend in a second direction DR2. A thickness direction of the display panel 700 may be defined as a third direction DR3. Although the display panel 700 approximately has a quadrangular shape, the present invention is not limited thereto. For example, the display panel 700 may be provided in a polygonal shape, a circular shape, an elliptical shape, or a shape corresponding to a portion of these in various exemplary embodiments of the present invention.

The display device according to an exemplary embodiment of the present invention may further include a flexible printed circuit board ("FPCB") 780 and a printed circuit board ("PCB") 770.

The FPCB 780 is bent and electrically connects the display panel 700 and the PCB 770. One end portion of the FPCB 780 may be connected onto one surface of the first substrate 710 that is exposed by the second substrate 720, and another end portion of the FPCB 780 may be connected to the PCB 770. The FPCB 780 may include a plurality of FPCBs 780. The plurality of FPCBs 780 may be spaced apart from each other in the first direction DR1. In FIG. 1, two FPCBs 780 are illustratively provided.

The PCB 770 may be coupled to the backlight unit BLU. The PCB 770 may output a signal to the display panel 700 or receive a signal from the display panel 700 through the FPCB 780.

In an exemplary embodiment of the present invention, an integrated circuit ("IC") chip may be mounted at the FPCB 780. A data driving chip may be provided at the IC chip. The data driving chip may transmit various signals to display images in the display area DA of the display panel 700. The FPCB 780 may transmit various signals to the data driving chip. The FPCB 780 may be a tape carrier package ("TCP") or a chip on film ("COF"). However, the present invention is not limited thereto. For example, the IC chip may be mounted directly on one surface of the first substrate 710.

The top cover 200 is spaced apart from the display panel 700 by a spacer SP, covers an edge of the display panel 700, and is coupled to the display panel 700 and the backlight unit BLU. The top cover 200 has an opening that exposes the display area DA of the display panel 700.

The top cover 200 may include a front cover 210 and a side cover 220. The front cover 210 may cover an edge of an upper surface of the display panel 700. The side cover 220 may cover side surfaces of the display panel 700 and the backlight unit BLU. For example, the front cover 210 may include an opening corresponding to the display area DA of the display panel 700, and may be disposed to overlap the non-display area NDA of the display panel 700. Thus, the display area DA of the display panel 700 may be exposed by the opening. The top cover 200 may include the front cover 210 parallel to a plane of the display panel 700, and one or more sidewalls of the side cover 220 extending from a rear surface of the front cover 210.

The backlight unit BLU is disposed below the display panel 700 to generate and provide light to the display panel 700.

The backlight unit BLU may include a bottom cover 300, a reflective sheet 400, a light source unit 500, a middle mold 600, a diffusion plate 100, and an optical sheet 800.

The bottom cover 300 may include a bottom portion 310 and a side wall 320.

The bottom portion 310 may be flat, and may be provided in a quadrangular shape in a plan view.

The side wall 320 may protrude to extend from an edge of the bottom portion 310, and may include first, second, third, and fourth side walls 321, 322, 323, and 324. The first, second, third, and fourth side walls 321, 322, 323, and 324 may be connected to four sides of the bottom portion 310, respectively.

The first side wall 321 may be parallel to and most adjacent to one side of the display panel 700 to which the FPCB 780 is attached. A portion of the first side wall 321 may be inclined with respect to the bottom portion 310. An angle formed between the portion of the first side wall 321 and the bottom portion 310 may be an obtuse angle. The second, third, and fourth side walls 322, 323, and 324 may extend from the bottom portion 310 in the third direction DR3.

The reflective sheet 400 is disposed on the bottom portion 310 of the bottom cover 300 and below the light source unit 500 to guide light emitted from the light sources 500 toward the top surface, and may be formed of a reflective material such as metal. The reflective sheet 400 reflects most of light incident thereon.

The backlight unit BLU may further include a driving substrate. The driving substrate may be disposed between the bottom portion 310 and the reflective sheet 400. The driving substrate may be electrically connected to the light source unit 500 to provide a driving signal to the light source unit 500. The driving substrate may be more than one, for example, a plurality of driving substrates may be provided below the reflective sheet 400.

The light source unit 500 is accommodated in the bottom cover 300. The light source unit 500 includes a plurality of light sources, and is disposed on the reflective sheet 400. The light source unit 500 is provided as a direct type, and light emitted from each light source is directly incident on the diffusion plate 100 without passing through a separate light guide plate.

Each of the light sources of the light source unit 500 may be a cold cathode fluorescent lamp (CCFL), a flat fluorescent lamp (FFL), or a light emitting diode (LED). Hereinafter, it is exemplarily described that each of the light sources of the light source unit 500 is an LED.

The light sources of the light source unit 500 may include white light sources that emit white light. However, the present invention is not limited thereto. In an exemplary embodiment of the present invention, the light sources may include a red light source that emits red light, a green light source that emits green light, and a blue light source that emits blue light.

The middle mold 600 includes a slope portion 610, a seating portion 620, and an elastic portion 630. In an exemplary embodiment of the present invention, the middle mold 600 couples with the bottom cover 300 to fix in place the reflective sheet 400, the light source unit 500, the diffusion plate 100, and the optical sheet 800.

The slope portion 610 and the seating portion 620 may include materials different from each other. The slope portion 610 and the seating portion 620 may include a metal or plastic material. In addition, the elastic portion 630 includes a silicon rubber compound (including, for example, silane) or a rubber material that has elasticity. The slope portion 610 extends from an end portion of the seating portion 620 toward the reflective sheet 400 and the light source unit 500. The slope portion 610 makes an obtuse angle with the seating portion 620.

The seating portion 620 of the middle mold 600 may be parallel to the bottom portion 310 of the bottom cover 300. The elastic portion 630 is mounted at an upper surface of the seating portion 620, and the seating portion 620 supports the elastic portion 630.

The elastic portion 630 may be attached to the seating portion 620 by an adhesive force of the elastic portion 630 itself. The elastic portion 630 may include a coupling protrusion that may be engaged with a coupling depression 621 of the seating portion 620 in an interlocking manner. The seating portion 620 has the coupling depression 621 that may accommodate a part of the elastic portion 630, i.e., the coupling protrusion.

The elastic portion 630 may extend along at least one of the first direction DR1 and the second direction DR2, and may support edges of four sides of the diffusion plate 100 and four sides of the optical sheet 800. In addition, the elastic portion 630 extends from the seating portion 620 in the third direction DR3. The elastic portion 630 allows the diffusion plate 100 and the optical sheet 800 to be spaced apart from the display panel 700 by a distance D1 in the third direction DR3. Accordingly, a thickness, in the third direction DR3, of the elastic portion 630 is greater than a sum of a thickness of the diffusion plate 100 and a thickness of the optical sheet 800.

The elastic portion 630 has a depression 632 that accommodates an edge portion of the diffusion plate 100. The depression 632 of the elastic portion 630 extends around the middle mold 600 and accommodates an end portion of the diffusion plate 100. The elastic portion 630 may be spaced apart from each end portion of the diffusion plate 100 and the optical sheet 800 by a distance D2 in the first direction DR1 and the second direction DR2. That is, the elastic portion 630 has a width greater than a width of the diffusion plate 100 to be inserted. For example, the distance D2 may be measured within the depression 632 of the elastic portion 630 in the first direction DR1 and the second direction DR2, and may be smaller than a depth of the depression 632 of the elastic portion 630 in the first direction DR1 and the second direction DR2.

In an exemplary embodiment of the present invention, the distance D2 between the elastic portion 630 and the diffusion plate 100 is substantially equal to the distance between the elastic portion 630 and the optical sheet 800. However, the present invention is not limited thereto. For example, the distances may be different from each other.

Due to the distances D1 and D2 secured for the elastic portion 630 with the diffusion plate 100 and the optical sheet 800, a difference in thermal expansion coefficient between the diffusion plate 100 and the elastic portion 630 may be compensated for in the first, second, and third directions DR1, DR2, and DR3.

The elastic portion 630 includes an opaque material and thus substantially prevents light leakage that may be caused by light having passed through the diffusion plate 100. For example, a side end portion of the elastic portion 630 surrounds three surfaces, e.g., a side surface, an upper surface, and a lower surface, of an end portion (e.g., edges) of the diffusion plate 100. Accordingly, the elastic portion 630 substantially prevents light leakage by blocking light that is incident between the diffusion plate 100 and the seating portion 620 and blocking light that is emitted toward the end portion of the diffusion plate 100 of the light that has passed through the diffusion plate 100.

At least a portion of the diffusion plate 100 may be inserted into the depression 632 of the elastic portion 630. The diffusion plate 100 serves to uniformly diffuse the light emitted from the light source unit 500. That is, the diffusion plate 100 may disperse the light incident from the light source unit 500 such that the light may be substantially prevented from being locally concentrated. For example, the diffusion plate 100 may diffuse light emitted from the light source unit 500 so as for the light to be supplied to the display panel 700, which is disposed above the optical sheet 800.

Figure 2:
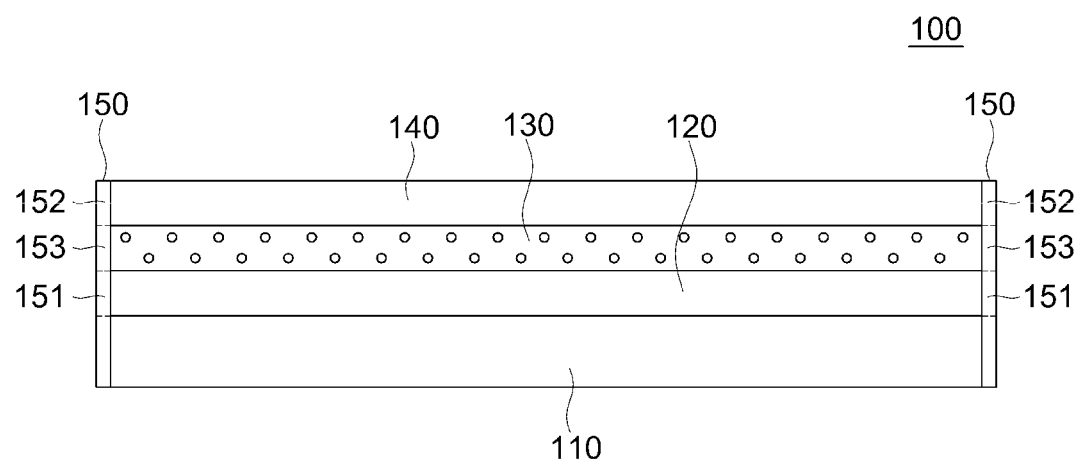
FIG. 2 is a cross-sectional view illustrating a detailed configuration of the diffusion plate illustrated in FIG. 1.
Figure 3:
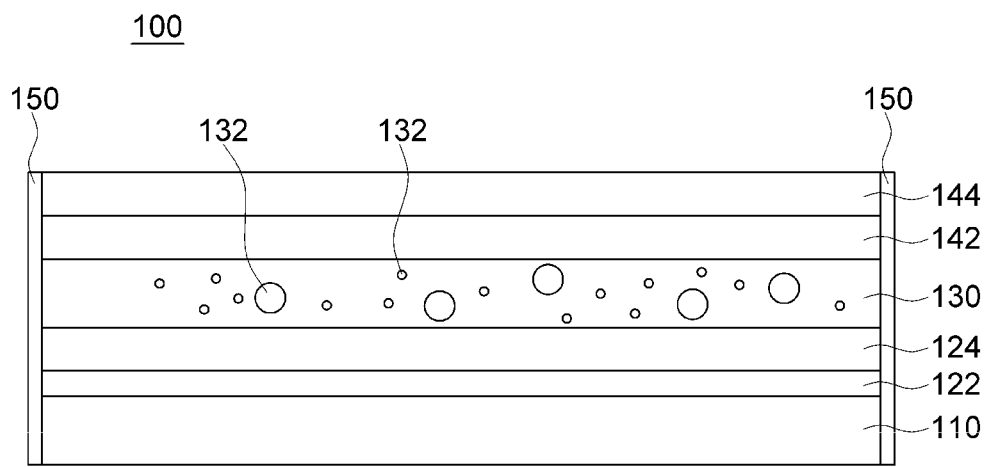
FIG. 3 is a cross-sectional view illustrating a diffusion plate with an internal structure of first and second passivation layers according to an exemplary embodiment of the present invention.

FIG. 2 is a cross-sectional view illustrating a detailed configuration of the diffusion plate illustrated in FIG. 1, and FIG. 3 is a cross-sectional view illustrating a diffusion plate with an internal structure of first and second passivation layers.

Referring to FIGS. 1 to 3, a diffusion plate 100 according to an exemplary embodiment of the present invention includes a glass plate 110, a first passivation layer 120, a wavelength conversion layer 130, a second passivation layer 140, and a laser trim portion 150.

The diffusion plate 100 serves to disperse and diffuse the light emitted from the light source unit 500 to enhance light uniformity. For example, the diffusion plate 100 may have good diffusibility (haze) and good light transmittance, so that uniform brightness may be achieved for the light emitted from the light source unit 500 and passing through the diffusion plate 100.

At the glass plate 110, one or more cells may be defined, and scribe lines may be marked at a boundary of each of the cells. The glass plate 110 may have haze properties. A haze value of the glass plate 110 may be in a range from about 30% to about 90%, and preferably in a range from about 50% to about 70%. If the haze value is greater than about 30%, light diffusivity may be sufficient to ensure light uniformity. In particular, when the haze value is greater than about 50%, the light diffusivity may be sufficient and thus a difference in light and darkness recognized on the side of a display screen may be reduced significantly. If the haze value is too great, light transmittance becomes lowered and luminance becomes lowered. From this point of view, the haze value may be about 90% or less, and more particularly, about 70% or less. The light transmittance of the glass plate 110 may be about 50% or more.

The first passivation layer 120 is disposed on the glass plate 110. In the present exemplary embodiment, the first passivation layer 120 may include a low refractive index layer 122 disposed on the glass plate 110 and a first barrier layer 124 disposed on the low refractive index layer 122, as illustrated in FIG. 3.

The low refractive index layer 122 may diffuse light and uniformly disperse the light on the whole. That is, the low refractive index layer 122 may refract a propagation direction of the light that is emitted in a random direction from the light source unit 500, and may have an overall uniform light distribution regardless of the disposition of the light source unit 500. The low refractive index layer 122 may have a refractive index of about 1.0 or more and about 1.5 or less. The low refractive index layer 122 may include at least one of silicon oxide ($SiO_2$) and magnesium fluoride ($MgF_3$). The low refractive index layer 122 may be formed to have a thickness of about 1,000 angstroms (Å) or more and about 6,000 angstroms (Å) or less.

Since the first barrier layer 124 contacts a bottom portion of the wavelength conversion layer 130, it may be also referred to as a bottom barrier layer.

The first barrier layer 124 serves to substantially prevent infiltration of moisture and/or oxygen (hereinafter, 'moisture/oxygen'). The first barrier layer 124 may include an inorganic material. For example, the first barrier layer 124 may include at least one of, for example, silicon nitride (Si$_3$N$_4$), aluminum nitride (AlN), zirconium nitride (ZrN), titanium nitride (TiN), hafnium nitride (HfN), tantalum nitride (TaN), silicon oxide (SiO$_2$), aluminum oxide (Al$_2$O$_3$), titanium oxide (TiO$_2$), tin oxide (SnO$_2$), cerium oxide (CeO$_2$) and silicon oxynitride (SiON), or a metal thin film in which light transmittance is ensured. The first barrier layer 124 may include a material substantially the same as a material included in the low refractive index layer 122, but the present invention is not limited thereto. The first barrier layer 124 may be formed by a method such as chemical vapor deposition (CVD).

The wavelength conversion layer 130 is disposed on the first passivation layer 120. That is, the wavelength conversion layer 130 is formed contacting an upper surface of the first barrier layer 124. For example, the first barrier layer 124 may be disposed on the bottom surface of the wavelength conversion layer 130 to prevent moisture/oxygen permeation into the wavelength conversion layer 130, thereby preventing deterioration of the wavelength conversion layer 130.

The wavelength conversion layer 130 converts a wavelength of at least a part of incident light. The wavelength conversion layer 130 may include wavelength converting particles 132.

In an exemplary embodiment of the present invention, the wavelength conversion layer 130 may include wavelength converting particles 132 uniformly dispersed in a resin. The resin may be formed of at least one of, for example, epoxy, silicone, polystyrene, acrylate, or a combination thereof. However, the present invention is not limited thereto. For example, the resin may include any transparent medium that does not affect the wavelength conversion performance of the wavelength converting particles 132.

The wavelength converting particle 132 is a particle for converting a wavelength of a light incident thereon, and may be, for example, a quantum dot (QD) fluorescent material or a phosphorescent material. Hereinafter, a quantum dot, which is an example of the wavelength converting particle 132, will be described in detail. The quantum dot (QD) fluorescent material or a phosphorescent material when used in a display device can produce pure monochromatic red, green, and blue light. A quantum dot is a material that has a crystal structure of a few nanometers in size, includes several hundreds to thousands of atoms, and shows quantum confinement effects, having an increased band gap, due to its small size. In a case where a light having a wavelength of which an energy is higher than the bandgap is incident on the quantum dot, the quantum dot is excited by absorbing the light and falls to a ground state as emitting a light of a specific wavelength. The emitted light of the specific wavelength has an energy value corresponding to the band gap. With such a quantum dot, the luminescence characteristics may be controlled based on the quantum confinement effect by adjusting its size and composition. Since the emitted light of the specific wavelength has an energy value corresponding to the band gap, by selecting materials of the quantum dot having different band gaps will convert the incident light on the quantum dot to different wavelengths. For example, light of a desired wavelength range may be obtained by controlling the composition of the quantum dot. On the other hand, even quantum dot that includes the same material may have different wavelengths according to its particle size. Since the smaller the quantum dot, the shorter the wavelength of light emitted from the quantum dot, light of a desired wavelength range may be obtained by controlling the size of the quantum dot.

The quantum dot may include, for example, at least one of group II-VI compounds, group II-V compounds, group III-VI compounds, group III-V compounds, group IV-VI compounds, group I-III-VI compounds, and group II-IV-VI compounds, and group II-IV-V compounds.

The quantum dot may include a core and a shell overcoating the core. The core may be or include at least one of, for example, cadmium sulfide (CdS), cadmium selenide (CdSe), cadmium telluride (CdTe), zinc sulfide (ZnS), zinc selenide (ZnSe), zinc telluride (ZnTe), gallium nitride (GaN), gallium phosphide (GaP), gallium arsenide (GaAs), gallium antimonide (GaSb), aluminum nitride (AlN), aluminum phosphide (AlP), aluminum arsenide (AlAs), aluminum antimonide (AlSb), indium phosphide (InP), Indium Arsenide (InAs), indium antimonide (InSb), silicon carbide (SiC), calcium (Ca), selenium (Se), indium (In), phosphor (P), iron (Fe), platinum (Pt), nickel (Ni), cobalt (Co), aluminum (Al), silver (Ag), gold (Au), copper (Cu), iron-platinum (FePt), ferrous oxide (Fe$_2$O$_3$), Iron(II, III) oxide (Fe$_3$O$_4$), silicon (Si), and germanium (Ge), but the present invention is not limited thereto. The shell may be or include at least one of, for example, zinc sulfide (ZnS), zinc selenide (ZnSe), zinc telluride (ZnTe), cadmium sulfide (CdS), cadmium selenide (CdSe), cadmium telluride (CdTe), mercury sulfide (HgS), mercury selenide (HgSe), mercury telluride (HgTe), aluminum nitride (AlN), aluminum phosphide (AlP), aluminum arsenide (AlAs), aluminum antimonide (AlSb), gallium nitride (GaN), gallium phosphide (GaP), gallium arsenide (GaAs), gallium antimonide (GaSb), cadmium selenide (GaSe), indium nitride (InN), indium phosphide (InP), indium arsenide (InAs), indium antimonide (InSb), thallium nitride (TlN), thallium phosphide (TlP), thallium arsenide (TlAs), thallium antimonide (TlSb), Lead sulfide (PbS), lead selenide (PbSe), and lead telluride (PbTe), but the present invention is not limited thereto.

The wavelength converting particle 132 may include a plurality of wavelength converting particles that may convert a wavelength of a light incident thereon to a different wavelength. For example, the wavelength converting particle 132 may include a first wavelength converting particle that converts an incident light having a specific wavelength into a light having a first wavelength and emits it, and a second wavelength converting particle that converts an incident light having a specific wavelength into a light having a second wavelength and emits it. In an exemplary embodiment of the present invention, a light emitted from the light source unit 500 and incident on the wavelength converting particle 132 may be a light having a blue wavelength, the first wavelength may be a green wavelength, and the second wavelength may be a red wavelength. For example, the blue wavelength may be a wavelength having a peak in a range from about 420 nm to about 470 nm, the green wavelength may be a wavelength having a peak in a range from about 520 nm to about 570 nm, and the red wavelength may be a wavelength having a peak in a range from about 620 nm to about 670 nm. However, it should be understood that the blue, green, and red wavelengths are not limited to the above examples, and may include all wavelength ranges that may be recognized in the art as blue, green, and red.

In an exemplary embodiment of the present invention, while the blue light incident on the wavelength conversion layer 130 passes through the wavelength conversion layer 130, a part of the blue light may be incident on the first wavelength converting particle, thus converted in terms of its wavelength into a green wavelength, and then emitted; another part of the blue light may be incident on the second wavelength converting particle, thus converted in terms of its wavelength into a red wavelength, and then emitted; and a remaining part of the blue light may not be incident on the first and second wavelength converting particles and emitted as it is without being converted in terms of its wavelength. Accordingly, the light that has passed through the wavelength conversion layer 130 may include a light having a blue wavelength, a light having a green wavelength, and a light having a red wavelength. If a ratio of the emitted lights having different wavelengths is appropriately adjusted, an emission light may display a white color or other colors. The lights converted by the wavelength conversion layer 130 are concentrated to a predetermined narrow wavelength range and has a sharp spectrum with a narrow half width. Accordingly, when color is realized by filtering the light having such a spectrum with a color filter, color reproducibility may be enhanced.

Dissimilar to the above exemplary embodiment, a white light may be produced when a light having a short wavelength, e.g., an ultraviolet light, is incident and three types of wavelength converting particles that convert the incident light in terms of its wavelength into blue, green, and red wavelengths, are disposed in the wavelength conversion layer 130.

The wavelength conversion layer 130 may further include scattering particles. The scattering particles may be non-quantum dot particles, which may not serve the wavelength converting function. The scattering particles scatter the incident light so that more incident light may be incident toward the wavelength converting particles 132. In addition, the scattering particles may serve to control emission angles of lights having different wavelengths. For example, when a part of the incident light is incident on the wavelength converting particle 132, and then its wavelength is converted and emitted, the scattering characteristic shows that an emission direction is random. If there is no scattering particle in the wavelength conversion layer 130, a light of a green or red wavelength that is emitted after colliding with the wavelength converting particle 132 has random scattering emission characteristics, while a light of a blue wavelength that is emitted without experiencing collision with the wavelength converting particle 132 does not have the random scattering emission characteristics, and thus respective emission amounts of lights having blue, green, and red wavelengths may differ from each other depending on the exit emission angle. Since the scattering particle imparts scattering characteristics to lights of different wavelengths including the light of a blue wavelength that is emitted without experiencing collision with the wavelength converting particle 132, the emission angles of the lights of different wavelengths may be adjusted accordingly. The scattering particle may include, for example, titanium oxide ($TiO_2$) or silicon oxide ($SiO_2$).

A thickness of the wavelength conversion layer 130 may be in a range from about 10 μm to about 50 μm. In an exemplary embodiment of the present invention, the thickness of the wavelength conversion layer 130 may be about 15 μm.

The wavelength conversion layer 130 may cover most of an upper surface of the first barrier layer 124, while exposing a part of an edge of the first barrier layer 124. In other words, a side surface of the first barrier layer 124 may protrude with respect to a side surface of the wavelength conversion layer 130. The upper surface of the first barrier layer 124 exposed by the wavelength conversion layer 130 provides a space where the side surface of the wavelength conversion layer 130 may be stably covered by the laser trim portion 150.

The wavelength conversion layer 130 may be formed by a method such as coating. For example, the wavelength conversion layer 130 may be formed by slit coating a wavelength converting composition over the diffusion plate 100, and then drying and curing the wavelength converting composition. However, the present invention is not limited thereto. For example, various other lamination methods may be applied.

The second passivation layer 140 is disposed on the wavelength conversion layer 130. The second passivation layer 140 may include a second barrier layer 142 disposed on the wavelength conversion layer 130, and an overcoat layer 144 disposed on the second barrier layer 142, as illustrated in FIG. 3.

The second barrier layer 142 serves to substantially prevent infiltration of moisture and/or oxygen. For example, the second barrier layer 142 may be disposed on the top surface of the wavelength conversion layer 130 to prevent moisture/oxygen permeation into the wavelength conversion layer 130, thereby preventing deterioration of the wavelength conversion layer 130. The second barrier layer 142 may include a material substantially the same as a material included in the first barrier layer 124, e.g., an inorganic material. For example, the second barrier layer 142 may include at least one of, for example, silicon nitride ($Si_3N_4$), aluminum nitride (AlN), zirconium nitride (ZrN), titanium nitride (TiN), hafnium nitride (HfN), tantalum nitride (TaN), silicon oxide ($SiO_2$), aluminum oxide ($Al_2O_3$), titanium oxide ($TiO_2$), tin oxide ($SnO_2$), cerium oxide ($CeO_2$) and silicon oxynitride (SiON), or a metal thin film in which light transmittance is ensured. The second barrier layer 142 may include a material substantially the same as a material included in the first barrier layer 124, but the present invention is not limited thereto. The second barrier layer 142 may be formed by a method such as chemical vapor deposition (CVD).

The first barrier layer 124 or the second barrier layer 142 may include an inorganic material. Such an inorganic material may include at least one of, for example, silicon nitride ($Si_3N_4$), aluminum nitride (AlN), zirconium nitride (ZrN), titanium nitride (TiN), hafnium nitride (HfN), tantalum nitride (TaN), silicon oxide ($SiO_2$), aluminum oxide ($Al_2O_3$), titanium oxide ($TiO_2$), tin oxide ($SnO_2$), cerium oxide ($CeO_2$) and silicon oxynitride (SiON), or a metal thin film in which light transmittance is ensured.

The diffusion plate 100 according to an exemplary embodiment of the present invention may include a laser trim portion 150 extending along respective edge portions of the first passivation layer 120, the wavelength conversion layer 130 and the second passivation layer 140. That is, the laser trim portion 150 is a sealed portion which is formed as respective edge portions of the first passivation layer 120, the wavelength conversion layer 130, and the second passivation layer 140 are melted along a cell boundary by thermal curing using laser. Accordingly, the laser trim portion 150 may partially include a carbonized material. Thus, the wavelength conversion layer 130 may be enclosed or sealed by the first passivation layer 120, the second passivation layer 140, and the laser trim portion 150. For example, the combination of the first barrier layer 124, the second barrier layer 142 and the laser trim portion 150 may enclose or seal the wavelength conversion layer 130, and may prevent moisture/oxygen from permeating into the wavelength conversion layer 130, thereby preventing deterioration of the wavelength conversion layer 130. FIG. 3 exemplifies a case where the laser trim portion 150 extends along the edges of the low refractive index layer 122, the first barrier layer 124, the wavelength conversion layer 130, the second barrier layer 142 and the overcoat layer 144. However, as long as the laser trim portion 150 extends along the edges of the first barrier layer 124, the wavelength conversion layer 130, and the second barrier layer 142, it may be sufficient to prevent the moisture/oxygen from permeating into the wavelength conversion layer 130. For example, in an exemplary embodiment of the present invention, the laser trim portion 150 may extend at least along edges of the first barrier layer 124, the wavelength conversion layer 130, and the second barrier layer 142.

The laser trim portion 150 may have a width greater than zero and less than about 60 mm.

As illustrated in FIG. 2, the laser trim portion 150 may include a first laser trim portion 151 extending from the first passivation layer 120; a second laser trim portion 152 extending from the second passivation layer 140; and a side cover layer 153 extending from the wavelength conversion layer 130.

The edge portions of the first passivation layer 120 and the second passivation layer 140 are melted by thermal curing using laser, and thus the first laser trim portion 151 and the second laser trim portion 152 are formed. Carbonization may occur on the material or materials at the edge portions of the first passivation layer 120 and the second passivation layer 140 during the thermal curing process using laser. Accordingly, the first laser trim portion 151 and the second laser trim portion 152 may include a carbonized material.

The first laser trim portion 151 and the second laser trim portion 152 do not overlap the wavelength conversion layer 130.

The side cover layer 153 may be formed as the edge portions of the first passivation layer 120 and the second passivation layer 140 are melted by thermal curing using laser. Accordingly, the side cover layer 153 may partially include a carbonized material. In the present exemplary embodiment, the side cover layer 153 is applied on a part of a side surface of the wavelength conversion layer 130. That is, as the side cover layer 153 covers and seals the wavelength conversion layer 130, it may substantially prevent infiltration of moisture or oxygen into the wavelength conversion layer 130.

At least one of the first laser trim portion 151 and the second laser trim portion 152 may include at least one or more mixed materials. Mixing of materials may occur in the edge portions of the first passivation layer 120 and the second passivation layer 140 during the thermal curing process using laser, due to the melting of these materials during laser treatment. That is, since the edge portions of the first passivation layer 120, the wavelength conversion layer 130, and the second passivation layer 140 are melted along a cell boundary by thermal curing using laser, a material included in the edge portion of the first passivation layer 120 and a material included in the edge portion of the wavelength conversion layer 130 may be mixed, a material included in the edge portion of the wavelength conversion layer 130 and a material included in the edge portion of the second passivation layer 140 may be mixed, and/or a material included in the edge portion of the first passivation layer 120 and a material included in the edge portion of the second passivation layer 140 may be mixed, in the first laser trim portion 151 and the second laser trim portion 152. In the present exemplary embodiment, the material included in the edge portion of the wavelength conversion layer 130 may be different from a material included in the wavelength conversion layer 130.

At least one of the first laser trim portion 151, the second laser trim portion 152, and the side cover layer 153 may include a carbonized material.

The laser trim portion 150 may be formed by thermal curing the overcoat layer 144 that is at an uppermost portion of the second passivation layer 140.

In an exemplary embodiment of the present invention, the overcoat layer 144 may include an organic material. For example, the overcoat layer 144 may include a polymer material.

Figure 4:
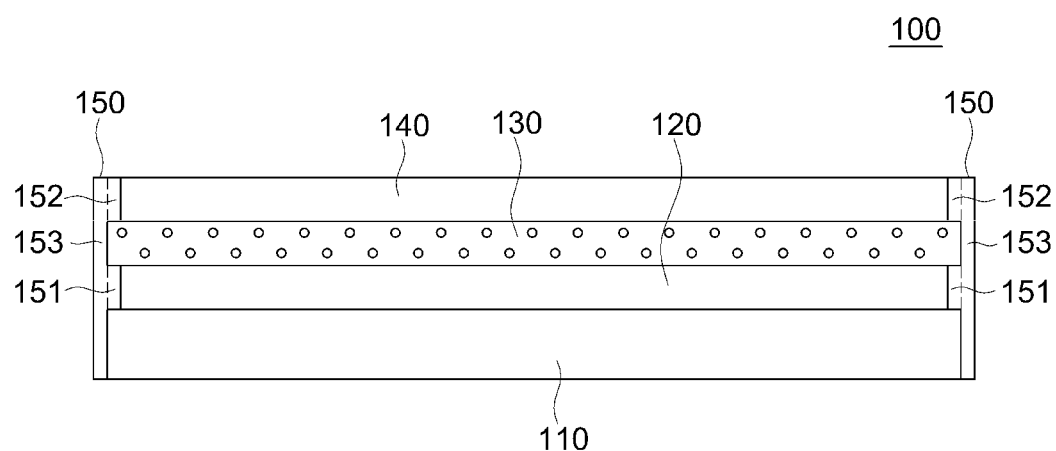
FIG. 4 is a cross-sectional view illustrating a diffusion plate according to an exemplary embodiment of the present invention.

FIG. 4 is a cross-sectional view illustrating a display device including a middle mold according to an exemplary embodiment of the present invention.

Referring to FIG. 4, a diffusion plate 100 according to an exemplary embodiment of the present invention may include a first laser trim portion 151 extending from a first passivation layer 120; a second laser trim portion 152 extending from a second passivation layer 140; and a side cover layer 153 extending from the first laser trim portion 151, the wavelength conversion layer 130, and the second laser trim portion 152.

The side cover layer 153 may be formed as edge portions of the first passivation layer 120 and the second passivation layer 140 are melted by thermal curing using laser. That is, the side cover layer 153 may be formed in the shape of covering and sealing the wavelength conversion layer 130 as the first passivation layer 120 and the second passivation layer 140 are melted by thermal curing using laser. Accordingly, at least one of the first laser trim portion 151, the second laser trim portion 152, and the side cover layer 153 may include a carbonized material. In an exemplary embodiment of the present invention, the thermal curing using laser may be performed on edge portions of the first passivation layer 120 and the second passivation layer 140, with at least part of these edge portions treated by the laser overlapping the wavelength conversion layer 130, to melt these edge portions to form the first laser trim portion 151, the second laser trim portion 152, and the side cover layer 153.

The side cover layer 153 may include a material mixed with at least one of a material included in the first laser trim portion 151 and a material included in the second laser trim portion 152. That is, since the side cover layer 153 is formed as the first laser trim portion 151 and the second laser trim portion 152 are melted by thermal curing using laser, the side cover layer 153 may include a material mixed with at least one of a material included in the first laser trim portion 151 and a material included in the second laser trim portion 152.

The first laser trim portion 151 and the second laser trim portion 152 may overlap the wavelength conversion layer 130, as illustrated in FIG. 4.

In an exemplary embodiment of the present invention, the first laser trim portion 151 and the second laser trim portion 152 may not overlap the wavelength conversion layer 130. That is, when edge portions of the first passivation layer 120 and the second passivation layer 140 are melted by thermal curing using laser, the first laser trim portion 151 and the second laser trim portion 152 may be formed so as not to overlap an edge portion of the wavelength conversion layer 130.

FIG. 5 is a view illustrating an exemplary embodiment of the present invention, in which an edge type backlight unit is applied to a diffusion plate.

Referring to FIG. 5, in a case where an edge type backlight unit BLU is applied to the diffusion plate 100 according to an exemplary embodiment of the present invention, a light source unit 500 facing a side surface of the diffusion plate 100 is disposed, and a plurality of optical sheets 800 are disposed between a display panel 700 and a light guide plate. A reflective sheet 400 is disposed below the light guide plate to reflect the light from the light source unit 500.

The diffusion plate 100 receives light emitted from the light source unit 500 and directs the light to the wavelength conversion layer 130 through a glass plate 110, a low refractive index layer 122 and a first barrier layer 124.

The wavelength conversion layer 130 converts the incident light in terms of its wavelength using wavelength converting particles 132, and emits the converted light toward the display panel 700 through a second barrier layer 142 and an overcoat layer 144.

In the present exemplary embodiment, the wavelength conversion layer 130 may convert the incident blue light into a green light using the wavelength converting particle 132 and emit the converted light, may convert the incident blue light into a red light using the wavelength converting particle 132 and emit the converted light, and/or may emit the incident blue light as it is without converting through the wavelength converting particle 132.

Figure 7:
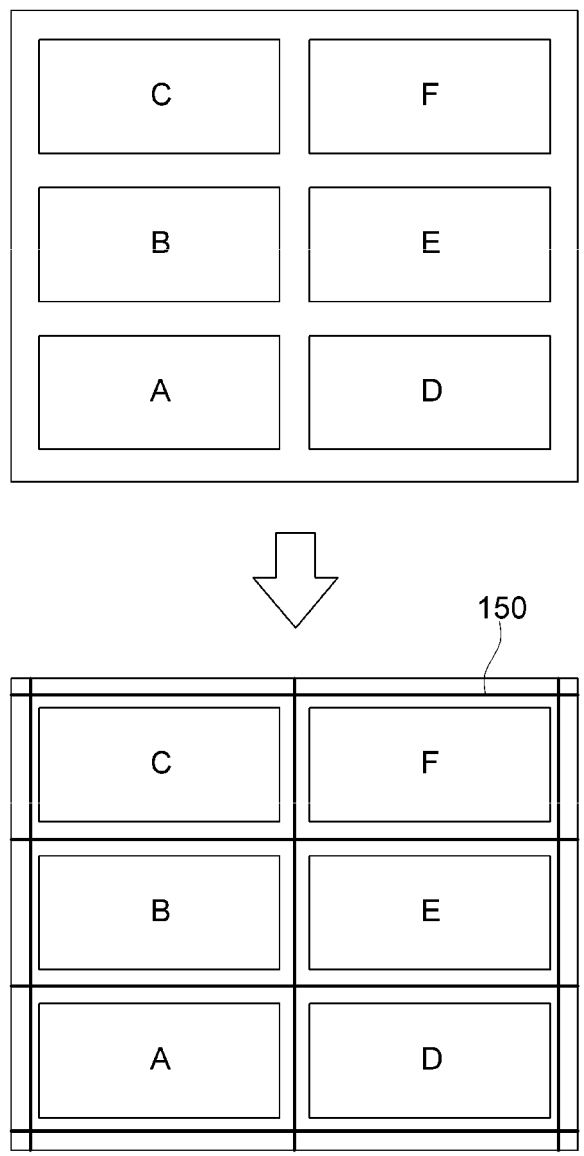

FIGS. 6 to 8 are views each illustrating an exemplary embodiment of the present invention, in which a laser trim portion is formed at a cell boundary after a diffusion plate according to an exemplary embodiment of the present invention is divided into cell units.

FIG. 6 shows an example in which the diffusion plate 100 according to an exemplary embodiment of the present invention is divided into cells in an 1□3 arrangement, and the laser trim portion 150 is formed at a boundary of each cell by laser thermal curing. That is, the diffusion plate 100 is divided into three cells A, B. and C of one row and three columns, thus defining three cells of 65 inches, and a boundary of each cell is thermally cured by laser beam to form the laser trim portion 150.

The diffusion plate 100 has a structure in which the glass plate 110, the first passivation layer 120, the wavelength conversion layer 130, and the second passivation layer 140 are stacked, as illustrated in FIG. 2.

In the diffusion plate 100 having such a structure, a boundary line of each cell is defined at the glass plate 110 through laser scribing, a laser beam is emitted onto the glass plate 110 along the boundary line of each cell to perform thermal curing, and thus the laser trim portion 150 that encloses each of the cells A, B, and C is formed. For example, when the laser beam is emitted along the boundary line of the cell A, four sides of the cell A are melted by a heat temperature of the laser beam and then cured, thus forming the laser trim portion 150. In the present exemplary embodiment, when emitted along the boundary line of the cell A, the laser beam is emitted to a portion of each of the second passivation layer 140, the wavelength conversion layer 130, and the first passivation layer 120 that corresponds to the four sides of the cell A, and melts the second passivation layer 140, the wavelength conversion layer 130, and the first passivation layer 120 along the four sides of the cell A to form the laser trim portion 150. Accordingly, the wavelength conversion layer 130 of the cell A may be sealed by the first passivation layer 120, the second passivation layer 140 and the laser trim portion 150, and infiltration of moisture or oxygen may be substantially prevented.

FIG. 7 shows an example in which the diffusion plate 100 according to an exemplary embodiment of the present invention is divided into cells in a 3012 arrangement, and the laser trim portion 150 is formed at a boundary of each cell by laser thermal curing. That is, the diffusion plate 100 is divided into six cells A, B, C, D, E and F of three rows and two columns, thus defining six cells of 55 inches, and a boundary of each cell is thermally cured by laser beam to form the laser trim portion 150. For example, when the laser beam is emitted along a boundary line of the cell F, the second passivation layer 140, the wavelength conversion layer 130, and the first passivation layer 120 are melted by laser heat along a boundary line of four sides of the cell F, and then cured to form the laser trim portion 150.

In the present exemplary embodiment, the laser trim portion 150 may be formed along a boundary line of each cell and may have a uniform width. The laser trim portion 150 may have a depth from the second passivation layer 140, which corresponds to a surface of each cell, to the first passivation layer 120 through the wavelength conversion layer 130. The laser trim portion 150 may include a material that is carbonized after thermal curing, and may include a material mixed with at least one of respective materials included in the first passivation layer 120, the wavelength conversion layer 130, and the second passivation layer 140.

FIG. 8 shows an example in which the diffusion plate 100 according to an exemplary embodiment of the present invention is divided into cells in a 604 arrangement, and the laser trim portion 150 is formed at a boundary of each cell by laser thermal curing. That is, the diffusion plate 100 is divided into 24 cells A, B, C, D, E, F, G, H, . . . , S, . . . , and X of six rows and four columns, thus defining 24 cells of 27 inches, and a boundary of each cell is thermally cured by laser beam to form the laser trim portion 150. For example, when the laser beam is emitted along a boundary line of the cell X, edge portions of the second passivation layer 140, the wavelength conversion layer 130, and the first passivation layer 120 are melted by laser heat along a boundary line of four sides of the cell X, and then cured to form the laser trim portion 150.

A material included in the edge portion of the second passivation layer 140, a material included in the edge portion of the wavelength conversion layer 130, and a material included in the edge portion of the first passivation layer 120 may be mixed by thermal curing in the laser trim portion 150. In addition, the laser trim portion 150 may partially include a carbonized material.

Figure 9:
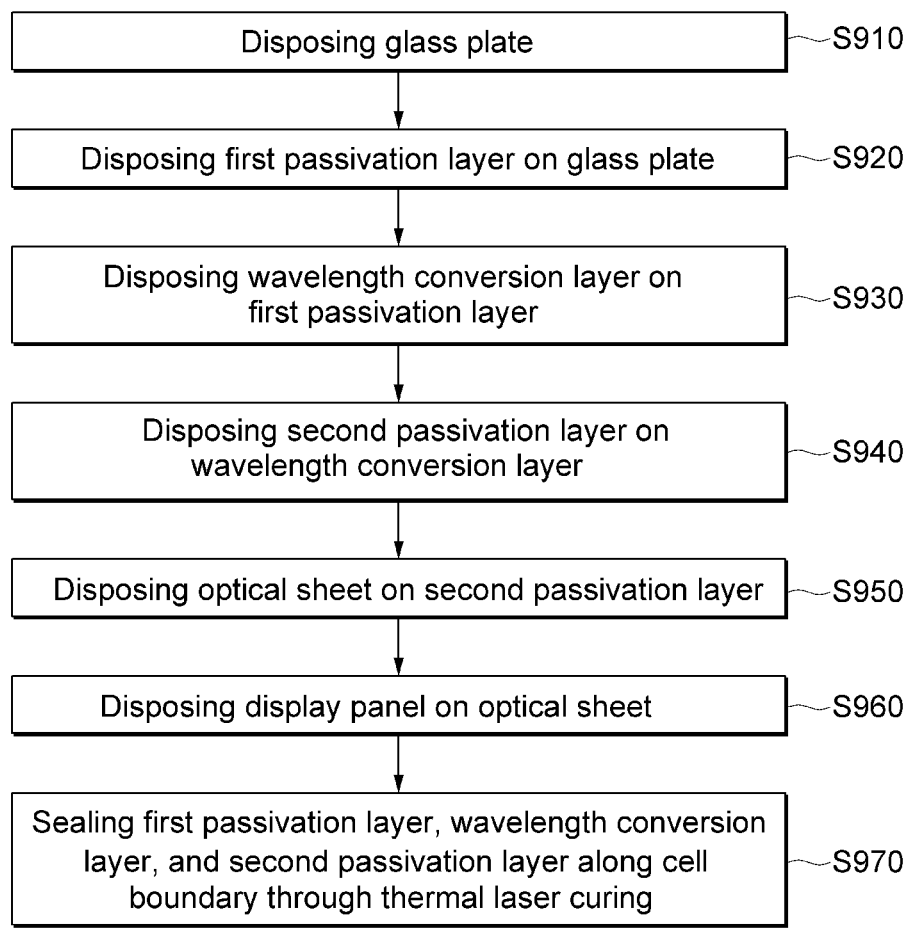
FIG. 9 is a flowchart illustrating a method of manufacturing a display device according to an exemplary embodiment of the present invention.

FIG. 9 is a flowchart illustrating a method of manufacturing a display device according to an exemplary embodiment of the present invention. The sequence of the steps as shown in the flowchart may be preferred. However, the present invention is not limited to the performance of these steps with the sequence or order presented in the flowchart. Many steps may also be applied to the glass plate before, between or after the steps shown in the flowchart.

Referring to FIGS. 1 to 9, in a method of manufacturing a display device according to an exemplary embodiment of the present invention, the glass plate 110 is firstly provided (S910) or is disposed on the light source unit 500 (FIG. 1) or on the reflective sheet (FIG. 5), and then the first passivation layer 120 is disposed on the glass plate 110 (S920).

In the present exemplary embodiment, the first passivation layer 120 includes the low refractive index layer 122 and the first barrier layer 124, as illustrated in FIG. 3.

Next, the wavelength conversion layer 130 is disposed on the first passivation layer 120 (S930).

In the present exemplary embodiment, the wavelength conversion layer 130 may include the wavelength converting particles 132 for converting a wavelength of at least a part of light incident thereon. The wavelength converting particles 132 may include, for example, a quantum dot (QD) fluorescent material or a phosphorescent material.

Next, the second passivation layer 140 is disposed on the wavelength conversion layer 130 (S940).

In the present exemplary embodiment, the second passivation layer 140 includes the second barrier layer 142 and the overcoat layer 144, as illustrated in FIG. 3.

Next, the optical sheet 800 is disposed on the second passivation layer 140 (S950)

Next, the display panel 700 is disposed on the optical sheet 800 (S960).

Next, the first passivation layer 120, the wavelength conversion layer 130, and the second passivation layer 140 are sealed along a boundary of each cell by thermal curing using laser (S970).

In an exemplary embodiment of the present invention, the passivation layer 120, the wavelength conversion layer 130, and the second passivation layer 140 may be sealed along a boundary of each cell by thermal curing using laser (S970) before the optical sheet 800 is disposed on the second passivation layer 140 (S950). In other words, the step S970 may be performed after the step S940 and before the step S950.

At the diffusion plate 100 according to an exemplary embodiment of the present invention, the laser trim portion 150 is formed by laser thermal curing along the boundary of each cell, as illustrated in FIG. 2. Accordingly, the laser trim portion 150 may include a carbonized material.

At least one of the first passivation layer 120, the wavelength conversion layer 130, and the second passivation layer 140 may include the laser trim portion 150 that extends along an edge thereof.

The laser trim portion 150 according to an exemplary embodiment of the present invention may include the first laser trim portion 151 extending from the first passivation layer 120; the second laser trim portion 152 extending from the second passivation layer 140; and the side cover layer 153 extending from the wavelength conversion layer 130, as illustrated in FIG. 2.

The laser trim portion 150 according to an exemplary embodiment of the present invention may include the first laser trim portion 151 extending from the first passivation layer 120; the second laser trim portion 152 extending from the second passivation layer 140; and the side cover layer 153 extending from the first laser trim portion 151, the wavelength conversion layer 130, and the second laser trim portion 152, as illustrated in FIG. 4.

The laser trim portion 150 may include a material mixed with at least one of a material included in an edge portion of the first laser trim portion 151, a material included in an edge portion of the wavelength conversion layer 130, and a material included in an edge portion of the second laser trim portion 152.

At least one of the first laser trim portion 151, the second laser trim portion 152, and the side cover layer 153 may include a carbonized material.

Figure 10:
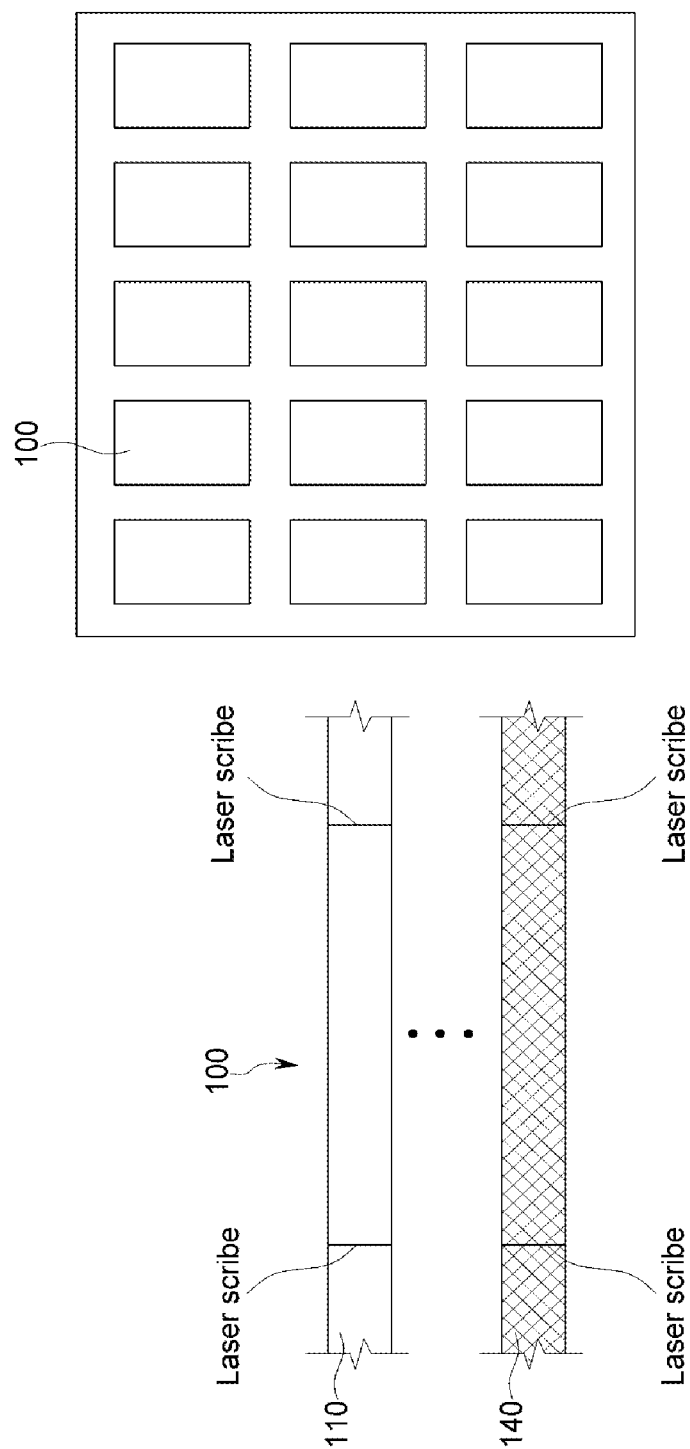
FIG. 10 is a view illustrating an exemplary embodiment of the present invention, in which a diffusion plate has a cell boundary line formed through a laser scribe process.
Figure 11:
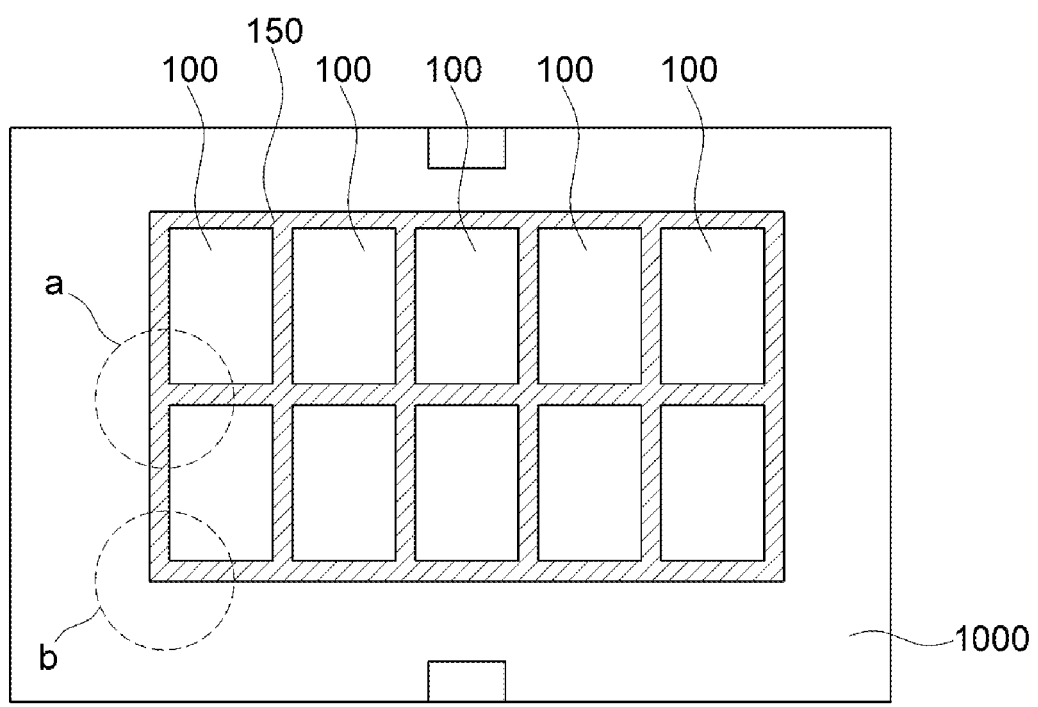
FIG. 11 is a view illustrating an exemplary embodiment of the present invention, in which a laser trim portion is formed at an edge of each of multiple cells.
Figure 12:
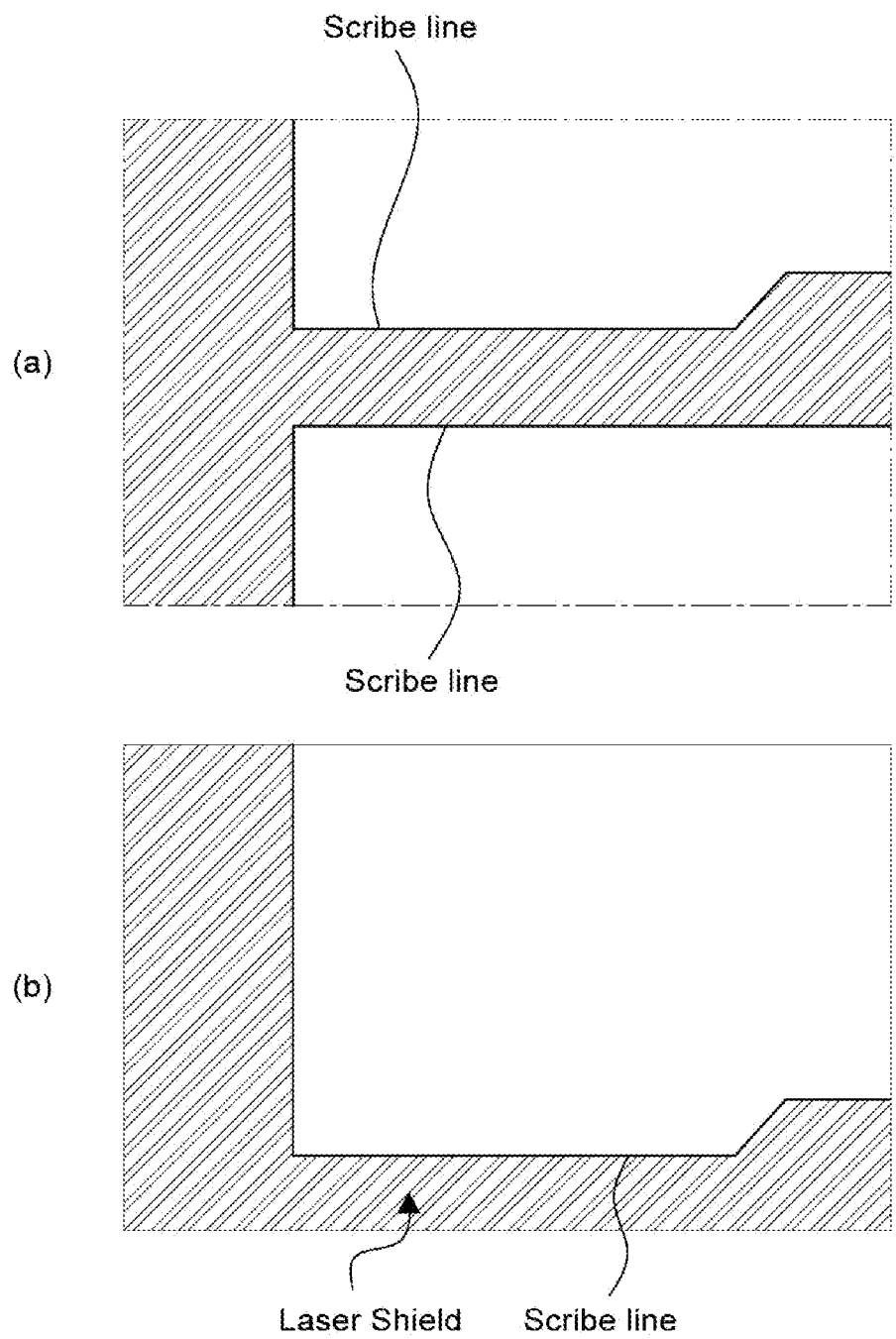
FIG. 12 is an enlarged view illustrating portions a and b in FIG. 11.

FIG. 10 is a view illustrating an exemplary embodiment of the present invention, in which a diffusion plate has a cell boundary line formed through a laser scribing process, FIG. 11 is a view illustrating an exemplary embodiment of the present invention, in which a laser trim portion is formed at an edge of each of multiple cells, and FIG. 12 is an enlarged view illustrating portions a and b in FIG. 11.

The diffusion plate 100 according to an exemplary embodiment of the present invention has a structure in which the glass plate 110, the first passivation layer 120, the wavelength conversion layer 130 and the second passivation layer 140 are laminated, and a cell boundary is defined at the diffusion plate 100 through laser scribing process, as illustrated in FIG. 10.

In FIG. 10, a scribe line of each cell is a cutting line for cutting each cell, and a non-light-transmissible material is patterned at an area between the scribe lines. This material is a kind of shield pattern, and the patterned area is not affected by light even when the substrate is irradiated with laser beam. Accordingly, the area between the scribe lines is kept attached to a support substrate in a light irradiation process, and is separated from a mother substrate together with the support substrate in a process of separating the support substrate from the mother substrate. The patterned area is formed at one surface of the support substrate (a surface where the support substrate and the mother substrate are attached to each other). In the present exemplar) embodiment, the mother substrate may be coated in the form of a film over the surface of the support substrate that is patterned.

In FIG. 11, the mother substrate 1000 is a plate for forming a unit structure (unit panel) of the cell of the display device. In the case of a flexible display device, a plastic film material (e.g., polyimide) that has excellent ductility may be used to form the mother substrate 1000. FIG. 11 shows a mother substrate 1000 in which a plurality of cells, i.e., unit display devices or diffusion plates 100, may be formed at a time. In a case where the mother substrate 1000 is the second substrate 720, as illustrated in FIG. 13, an upper panel of the display device may be formed by stacking the color filter layer 730 on the second substrate 720. On the other hand, in a case where the mother substrate 1000 is the first substrate 710, a lower panel of the display device may be formed by stacking an organic light emitting layer 740 on the first substrate 710.

As illustrated in FIGS. 11 and 12, a scribe line is defined along a boundary of each cell by a laser beam, and an area outside the boundary is patterned with a laser shield pattern. The scribe line may be defined with a depth corresponding to a depth of the mother substrate 1000. After the scribing process, the laser trim portion 150 that encloses each cell is formed at the mother substrate 1000 by laser thermal curing along the boundary line of each cell. FIG. 12 is an enlarged view illustrating a portion a and a portion b in FIG. 11. The laser trim portion 150 may be formed in a straight line along each side of a quadrangular shape defining the boundary of each cell, but the present invention is not limited thereto. A part of the laser trim portion 150 may be formed in a certain shape.

Figure 14:
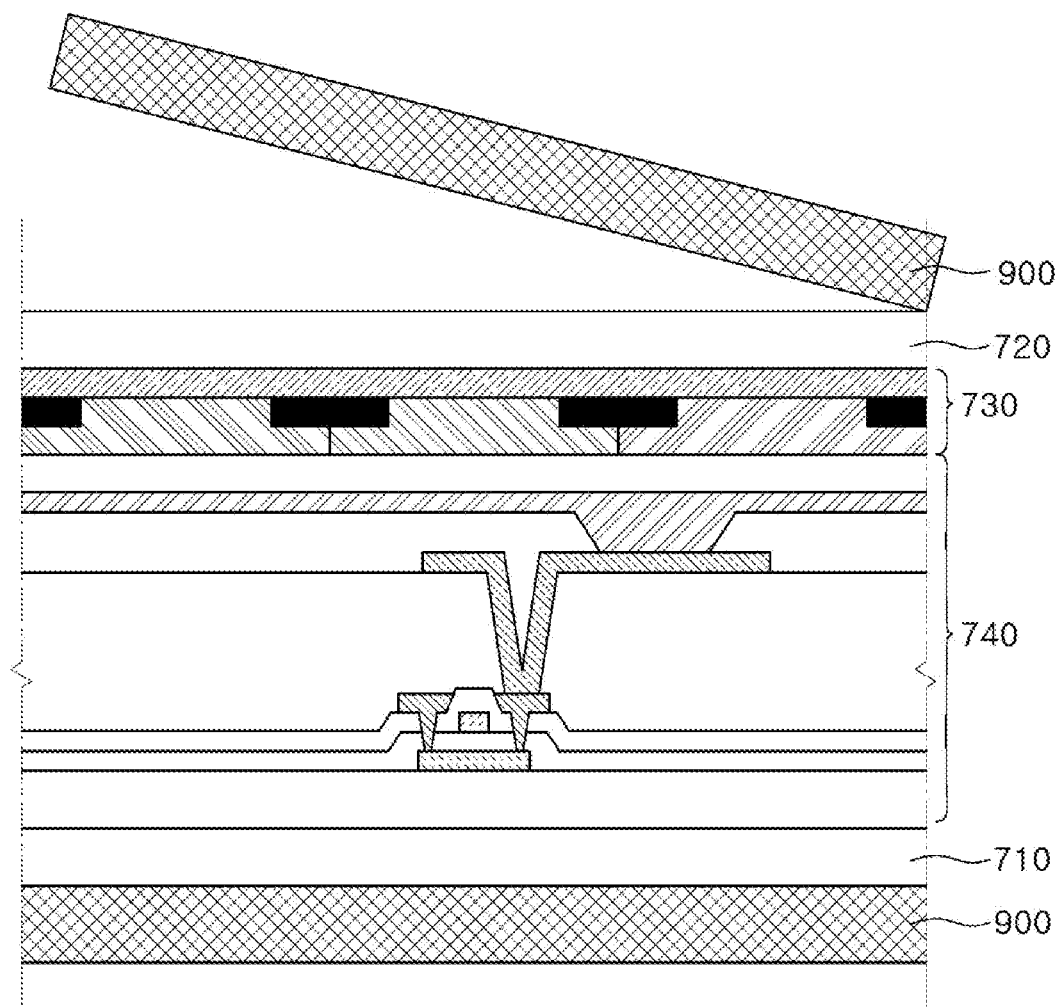

FIGS. 13 and 14 are views illustrating an exemplary embodiment of the present invention, in which a color filter layer and an organic light emitting layer are formed between a first substrate and a second substrate of a display panel according to an exemplary embodiment of the present invention.

As illustrated in FIG. 13, in the upper panel of the display device according to an exemplary embodiment of the present invention, the second substrate 720 is attached onto the glass substrate 900, and the color filter layer 730 is disposed on the second substrate 720.

In the lower panel of the display device according to an exemplary embodiment of the present invention, the first substrate 710 is attached onto the glass substrate 900, and the organic light emitting layer 740 is disposed on the first substrate 710.

The color filter layer 730 expresses color using light emitted from the organic light emitting layer 740.

The organic light emitting layer 740 may include a thin film transistor (TFT) layer and an electroluminescent layer. The thin film transistor layer is formed on the first substrate 710, and is a layer in which switch elements for supplying data voltages to pixel electrodes are arranged.

The color filter layer 730 is formed at one surface of the second substrate 720 which is an upper substrate, and the second substrate 720 is attached to the glass substrate 900. The first substrate 710 on one surface of which the organic light emitting layer 740 is formed is attached to the second substrate 720.

After the first substrate 710 and the second substrate 720 are attached to each other, the glass substrate 900, which is the support substrate of the second substrate 720, is removed. That is, as illustrated in FIG. 14, the glass substrate 900 attached to the second substrate 720 is removed by laser beam.

The removal of the support substrate may be performed by irradiating an entire area of the support substrate with a laser beam. In the present exemplary embodiment, an interface between the support substrate and the mother substrate undergoes shrinkage/expansion due to the influence of the laser beam, and the attachment is relieved. For example, the laser beam may be irradiated onto the upper surface of the support substrate (e.g., the glass substrate 900). The laser may be an ultraviolet (UV) ray or any other suitable ray with suitable wavelength. The laser beam may be provided to the mother substrate (e.g., the second substrate 720) through the support substrate (e.g., the glass substrate 900). Thus, the interface portion between the glass substrate 900 and the second substrate 720, for example, bonding force between the glass substrate 900 and the second substrate 720, may be weakened by the laser beam, so that separation between the glass substrate 900 and the second substrate 720 may be achieved as show in FIG. 14.

An area between the boundary lines of the respective cells in the second substrate 720, which is the upper substrate, may be removed by applying a physical force by hand. Then, the second substrate 720 is cut into each cell, and post-processes are performed for each cell.

In the case of the first substrate 710, which is a lower substrate, post-processes are also performed for each cell, after the glass substrate 900, which is the support substrate, is removed by laser beam and the first substrate 710 is cut into each cell.

According to an exemplary embodiment of the present invention, a quantum dot display device capable of substantially preventing infiltration of moisture or oxygen ($O_2$) into a quantum dot layer and a method of manufacturing the quantum dot display device may be provided by scribe cutting a display panel including quantum dots into cell units, and thermally curing an edge portion of each cell for sealing the quantum dot layer in a process of manufacturing the quantum dot display device.

As set forth hereinabove, in a process of manufacturing a display device according to the present invention, a cell edge portion is thermally cured with laser and sealed after scribe cutting, and thus infiltration of moisture or oxygen into a quantum dot layer may be substantially prevented.

Since a laser trimming process is added after the scribe cutting process at an area between cells where a quantum dot glass does not guide light, the quantum dot layer and upper and lower barrier layers may be integrated. Accordingly, reliability issues, e.g., quenching discoloration, may be substantially prevented.

While the present invention has been illustrated and described with reference to the exemplary embodiments thereof, it will be apparent to those of ordinary skill in the art that various changes in form and detail may be made therein without departing from the spirit and scope of the present invention as defined by the appended claims.

What is claimed is:

1. A display device comprising:
   a glass plate;
   a first passivation layer disposed on the glass plate;
   a wavelength conversion layer disposed on the first passivation layer;
   a second passivation layer disposed on the wavelength conversion layer;
   an optical sheet disposed on the second passivation layer;
   a display panel disposed on the optical sheet; and
   a laser trim portion extending along edges of the first passivation layer, the wavelength conversion layer, and the second passivation layer.

2. The display device of claim 1, wherein the laser trim portion comprises a carbonized material.

3. The display device of claim 1, wherein the laser trim portion comprises:
   a first laser trim portion extending from the first passivation layer;
   a second laser trim portion extending from the second passivation layer; and
   a side cover layer extending from the wavelength conversion layer.

4. The display device of claim 3, wherein at least one of the first laser trim portion, the second laser trim portion, and the side cover layer comprises a carbonized material.

5. The display device of claim 3, wherein the first laser trim portion and the second laser trim portion do not overlap the wavelength conversion layer.

6. The display device of claim 1, wherein the laser trim portion comprises:
   a first laser trim portion extending from the first passivation layer;
   a second laser trim portion extending from the second passivation layer; and
   a side cover layer extending from the first laser trim portion, the wavelength conversion layer, and the second laser trim portion.

7. The display device of claim 6, wherein at least one of the first laser trim portion, the second laser trim portion, and the side cover layer comprises a carbonized material.

8. The display device of claim 6, wherein the first laser trim portion and the second laser trim portion overlap the wavelength conversion layer.

9. The display device of claim 6, wherein the first laser trim portion and the second laser trim portion do not overlap the wavelength conversion layer.

10. The display device of claim 1, wherein the first passivation layer comprises:
    a low refractive index layer disposed on the glass plate; and
    a first barrier layer disposed on the low refractive index layer.

11. The display device of claim 1, wherein the second passivation layer comprises:
    a second barrier layer disposed on the wavelength conversion layer; and
    an overcoat layer disposed on the second barrier layer.

12. The display device of claim 1, wherein the wavelength conversion layer comprises wavelength converting particles that convert a wavelength of at least a part of incident light.

13. The display device of claim 12, wherein the wavelength converting particles comprise a quantum dot (QD) fluorescent material or a phosphorescent material.

14. A method of manufacturing a display device, the method comprising:
disposing a first passivation layer on a glass plate;
disposing a wavelength conversion layer on the first passivation layer;
disposing a second passivation layer on the wavelength conversion layer;
disposing an optical sheet on the second passivation layer;
disposing a display panel on the optical sheet; and
thermally curing the first passivation layer, the wavelength conversion layer, and the second passivation layer, and sealing the same along a boundary of a cell using laser.

15. The method of claim 14, wherein in the thermally curing of the first passivation layer, the wavelength conversion layer, and the second passivation layer, and sealing the same along the boundary of the cell using laser, a laser trim portion extending along edges of the first passivation layer, the wavelength conversion layer, and the second passivation layer is formed.

16. The method of claim 15, wherein the laser trim portion comprises a carbonized material.

17. The method of claim 15, wherein in the thermally curing of the first passivation layer, the wavelength conversion layer, and the second passivation layer, and sealing the same along the boundary of the cell using laser, the laser trim portion comprises:
a first laser trim portion extending from the first passivation layer;
a second laser trim portion extending from the second passivation layer; and
a side cover layer extending from the wavelength conversion layer.

18. The method of claim 17, wherein at least one of the first laser trim portion, the second laser trim portion, and the side cover layer comprises a carbonized material.

19. The method of claim 15, wherein in the thermally curing of the first passivation layer, the wavelength conversion layer, and the second passivation layer, and sealing the same along the boundary of the cell using laser, the laser trim portion comprises:
a first laser trim portion extending from the first passivation layer;
a second laser trim portion extending from the second passivation layer; and
a side cover layer extending from the first laser trim portion, the wavelength conversion layer, and the second laser trim portion.

20. The method of claim 19, wherein at least one of the first laser trim portion, the second laser trim portion, and the side cover layer comprises a carbonized material.

21. The method of claim 19, wherein the first laser trim portion and the second laser trim portion overlap the wavelength conversion layer.

22. The method of claim 19, wherein the first laser trim portion and the second laser trim portion do not overlap the wavelength conversion layer.

23. The method of claim 14, wherein in the disposing of the second passivation layer on the wavelength conversion layer, the wavelength conversion layer comprises wavelength converting particles that convert a wavelength of at least a part of incident light.

24. The method of claim 23, wherein the wavelength converting particles comprise a quantum dot (QD) fluorescent material or a phosphorescent material.

25. A display device comprising:
a reflective sheet;
a diffusion plate disposed on the reflective sheet;
a light source unit disposed between the reflective sheet and the diffusion plate, or disposed to face a side surface of a light guide plate included in the diffusion plate;
an optical sheet disposed on the diffusion plate; and
a display panel disposed on the optical sheet 800,
wherein the diffusion plate comprises:
a glass plate;
a low refractive index layer disposed on the glass plate;
a first barrier layer disposed on the low refractive index layer;
a wavelength conversion layer disposed on the first barrier layer;
a second barrier layer disposed on the wavelength conversion layer;
an overcoat layer disposed on the second barrier layer; and
a laser trim portion extending at least along edges of the first barrier layer, the wavelength conversion layer, and the second barrier layer.

26. The display device of claim 25, wherein the wavelength conversion layer comprises wavelength converting particles, which comprise a quantum dot (QD) fluorescent material or a phosphorescent material, uniformly dispersed in a resin.

* * * * *